United States Patent [19]

Caspari et al.

[11] 4,020,419
[45] Apr. 26, 1977

[54] ELECTRONIC SYSTEM FOR AUTOMATICALLY TUNING TO A SELECTED TELEVISION CHANNEL

[75] Inventors: Fred W. Caspari, South Bend; Wayne C. Johnson, Columbia City, both of Ind.

[73] Assignee: The Magnavox Company, Fort Wayne, Ind.

[22] Filed: June 5, 1974

[21] Appl. No.: 476,503

[52] U.S. Cl. .............................. 325/421; 325/470; 331/19
[51] Int. Cl.² .................................................. H03B 3/08
[58] Field of Search ............... 325/346, 416–423, 325/452, 453, 455, 457, 459, 460, 468, 470, 464; 334/15, 16; 178/DIG. 15; 331/1 A, 2, 8, 16, 17, 179, 4, 10, 11, 19, 25, 31, 34, 40; 329/139, 178

[56] References Cited

UNITED STATES PATENTS

| | | | |
|---|---|---|---|
| 3,221,266 | 11/1965 | Vitkovits | 331/4 |
| 3,259,851 | 7/1966 | Braver | 331/1 A |
| 3,641,434 | 2/1972 | Yates | 331/19 |
| 3,818,353 | 6/1974 | Saramoto | 325/457 |
| 3,846,707 | 11/1974 | Sakamoto | 325/453 |
| 3,857,107 | 12/1974 | Lieberman et al. | 331/1 A |
| 3,864,636 | 2/1975 | Fukuda et al. | 325/470 |
| 3,924,192 | 12/1975 | George | 325/470 |

Primary Examiner—Robert L. Griffin
Assistant Examiner—Jin F. Ng
Attorney, Agent, or Firm—William Holloway; George R. Pettit; Thomas A. Briody

[57] ABSTRACT

An all electronic tuning system is described for establishing a frequency of a local oscillator in a television receiver. When a channel selection is made, a number representing the desired channel is entered in a memory circuit. A first plurality of frequencies is generated in response to a channel selection, and a VCO employed as a local oscillator is caused to increase in frequency. When the VCO frequency differs from the first plurality of frequencies by a predetermined amount, a second plurality of frequencies is generated. Each frequency generated in said second plurality of frequencies is compared with said VCO frequency. When a predetermined difference exists between said VCO frequency and said second plurality of frequencies, a count is recorded. When the recorded count is equivalent to the number obtained in the memory circuit, the VCO tuning is inhibited and the VCO frequency is stabilized until a subsequent channel selection is made.

1 Claim, 3 Drawing Figures

ELECTRONIC SYSTEM FOR AUTOMATICALLY TUNING TO A SELECTED TELEVISION CHANNEL

BACKGROUND OF THE INVENTION

1. Field of the Invention

This invention relates generally to the electronic tuning of a signal-receiving unit to a selected frequency and more particularly to apparatus for the automatic tuning of a television receiver to the selected channel.

2. Description of the Prior Art

The tuning system of television receiver units, according to the prior art, provides for a received broadcast signal and an output signal from a local oscillator to be applied to a heterodyne conversion transducer. The output signal of the conversion transducer is applied to an automatic frequency control conduit, including a discriminator, which in turn controls the local oscillator. The output signal of the transducer is also applied to intermediate frequency apparatus tuned to a difference or beat frequency between the received signal and the local oscillator frequency. The discriminator characteristics are chosen so that the local oscillator signal is maintained at a frequency to provide optimum performance of the intermediate frequency apparatus and subsequent demodulation apparatus of the television receiver. There is a local oscillator frequency which provides for the demodulation of each television channel.

It is known in the prior art to provide mechanical apparatus for providing a course frequency adjustment for the local oscillator. The AFC circuit provides the vernier control of the local oscillator frequency. It would be desirable to replace the mechanical apparatus with electronic apparatus to reduce maintenance problems associated with mechanical apparatus.

In the prior art, the received broadcast signal is used in conjunction with the local oscillator frequency in an automatic frequency tuning circuit. Originally, the received broadcast signal was utilized in order to minimize changes in the frequency of the output signal of the local oscillator. However, an internal reference frequency can be employed in the AFC circuit without compromising the channel reception by the television receiver.

It is a desirable feature of a television tuning system to provide that the entry of a channel number in the television receiver results in the entered channel being demodulated and the audio/visual information being available. It is also a desirable feature of a television system to tune electronically to a desired channel, decreasing the maintenance problems as well as expediting production of the channel information after entry of the selected channel designation in the system.

It is therefore an object of the present invention to provide an improved system for tuning to a preselected frequency.

It is another object of the present invention to provide an improved television receiver.

It is yet another object of the present invention to provide an electronic system for tuning to a selected television channel.

It is a particular object of the present invention to provide an electronic automatic frequency tuning circuit for tuning to a preselected frequency in which a local oscillation signal and a reference generator signal are combined to stabilize the oscillator signal frequency.

It is another particular object of the present invention to provide an electronic automatic frequency tuning circuit including a local oscillator capable of electronically sweeping the frequency of the oscillator through a frequency region.

It is yet another particular object of the present invention to provide a means for halting the frequency of a local oscillator signal frequency at a selected value.

It is a still more particular object of the present invention to identify a selected television channel by counting the number of beat frequency signals resulting from a combining of a variable local oscillator and a set of harmonic frequency signals.

It is a still further object of the present invention to provide an electronic automatic frequency tuning circuit with a reference signal generator producing a comb of harmonic frequency signals, the beat frequency signals occurring between varying local oscillator signal and the generator signals identifying a preselected local oscillator signal, and the combined signals of the local oscillator signal and a selected harmonic frequency of the reference generator used to stabilize the local oscillator signal.

It is a further object of the present invention to provide an electronic automatic frequency tuning circuit capable of tuning to every available commercial television channel.

SUMMARY OF THE INVENTION

The aforementioned and other objects are accomplished, according to the present invention, by an automatic frequency tuning circuit including a local oscillator with a controllable frequency output signal, apparatus for continuously varying the frequency of the oscillator output signal, and apparatus for combining the local oscillator output signal with a signal from a reference signal generator. The combined signals are used to identify a selected frequency of the local oscillator and suspend the changing of the frequency of the local oscillator signal. The combined signals are also used in conjunction with a discriminator circuit to stabilize the frequency of the local oscillator signal once the selected frequency is attained.

Upon entry of a channel designation into control apparatus of the automatic frequency tuning circuit, the channel designation causes the binary encoded channel designation to be entered in storage circuits and a related initial value to be entered in counting circuits of control apparatus. After entry of the initial values in the counting circuits, the local oscillator output signal frequency is continuously increased from a predetermined initial frequency. The signal from the reference generator, comprised of a comb of 6 MHz harmonic frequency signal components, is applied, along the output signal of the local oscillator to a heterodyne conversion transducer. The 1 MHz beat frequency signals from the transducer are transmitted by a tuned circuit and are counted by the counting circuits of the control apparatus. Television channels, excluding channel 5 and channel 6, have frequencies 1 MHz removed from appropriate 6 MHz harmonic frequencies. The local oscillator will provide the appropriate local oscillator frequency when the related number of counts has been identified by the control apparatus.

Thereafter, the output of the tuned circuit, applied to the discriminator, stabilizes the frequency of the local oscillator signal to provide optimum performance of the receiver apparatus.

Channel 5 and channel 6 can be tuned by separate apparatus.

These and other features of the invention will be understood upon reading of the following description along with the drawings.

DESCRIPTION OF THE PREFERRED EMBODIMENT

Detailed Description of the Figures

Figure 1:
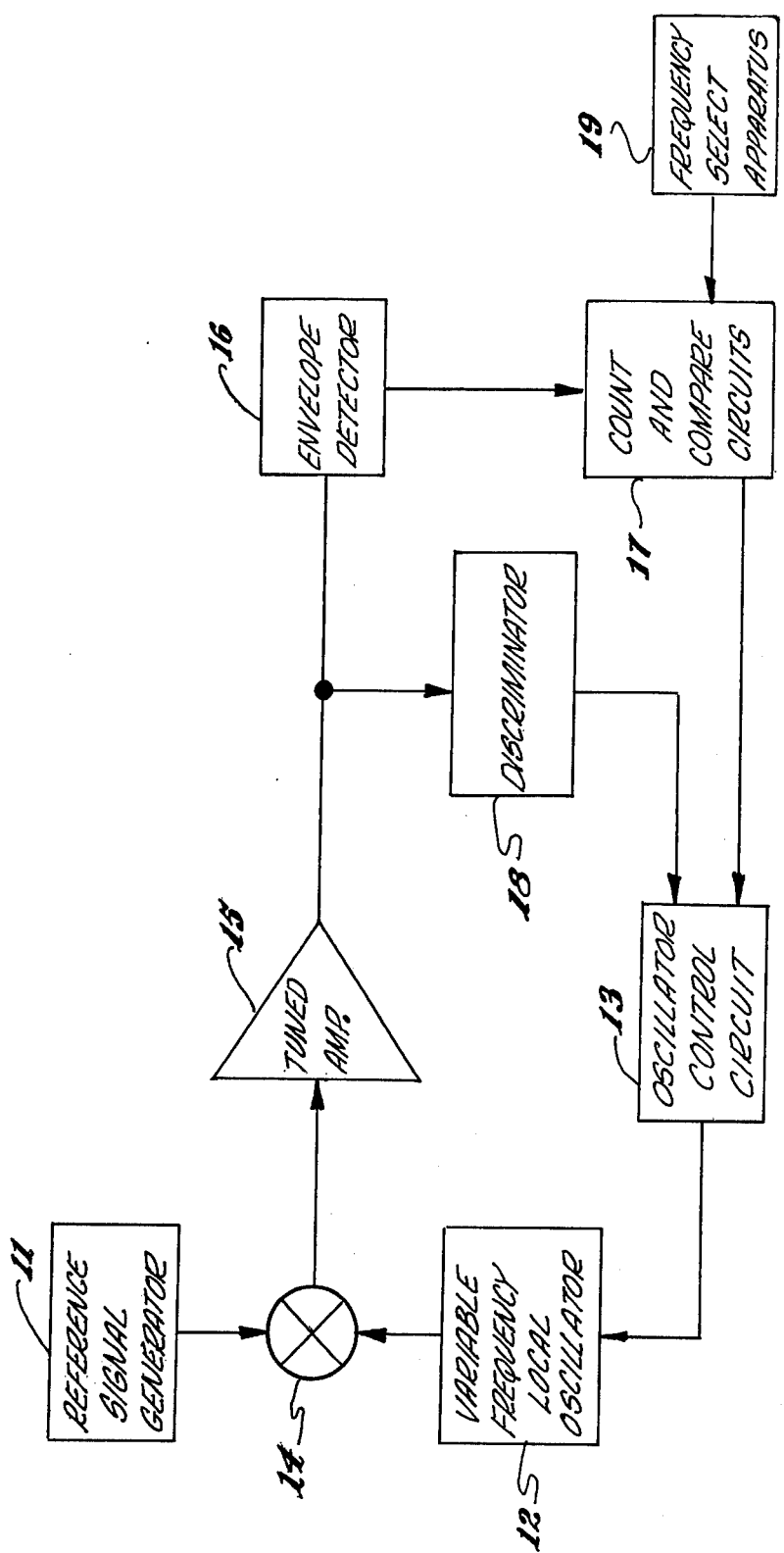
FIG. 1 is a block diagram of the principal functional areas of the automatic frequency tuning circuit according to the present invention.

Referring now to FIG. 1, a block diagram of the principal areas of apparatus according to the present invention are shown. Reference signal generator 11 produces, in the preferred embodiment, a series of harmonic frequencies which are applied to heterodyne converter transducer 14. Concurrently, oscillator control circuit 13 provides a signal to controllable frequency local oscillator 12 which controls the frequency of the output signal of the local oscillator 12. The signal of local oscillator 12 is applied to transducer 14 and combined with the signal from the reference signal generator 11.

An output signal of transducer 14 is then applied to tuned amplifier 15. Amplifier 15 is tuned to a beat or difference frequency resulting from the combination of the local oscillator frequency signal and the set of harmonic signals of the reference signal generator. The output signal of tuned amplifier 15 is applied to envelope detector 16 and to discriminator 18.

A beat frequency signal will be transmitted to the output terminal of the tuned amplifier 15 when the frequency of the local oscillator signal and one of the harmonic frequency components of generator 11 differ by the frequency to which amplifier 15 is tuned. The beat frequency signal is applied to an envelope detector 16. Detector 16 produces a pulse upon the occurrence of the beat frequency and applies this pulse to count and compare circuits 17.

Count and compare circuits 17 contain circuits for counting the number of beat frequency signals which are applied to the output terminal of amplifier 15 and for comparing this number with a number stored in a memory portion of circuits 17. The contents of the memory portions of circuits 17 are entered by means of frequency select apparatus 19 which also provides for presetting of quantities in certain count circuits. Upon a determination that the beat frequency signal count corresponds to a number entered in circuits 17 by the frequency select apparatus 19, the signal applied to oscillator control circuit 13 is removed resulting in suspension of the increase of frequency of the oscillator output signal. Upon activation of apparatus 19, a signal from count and compare circuits 17 causes the oscillator control circuit to provide an output signal from local oscillator of increasing frequency. Concurrently, the output signal from discriminator 18, applied to circuit 13, is used to control the frequency of the output signal from the local oscillator 12.

The discriminator 18 provides a frequency response to the output signal of tuned amplifier 15 which permits the network loop comprised of discriminator, oscillator control circuit 13, controllable frequency local oscillator 12, transducer 14, and amplifier 15 to lock on the beat frequency signal resulting from the combination of the local oscillator signal and the generator harmonic signal component producing last count of circuit 17. The operation of this type of automatic frequency control circuit will be apparent to those skilled in the art.

Figure 2:
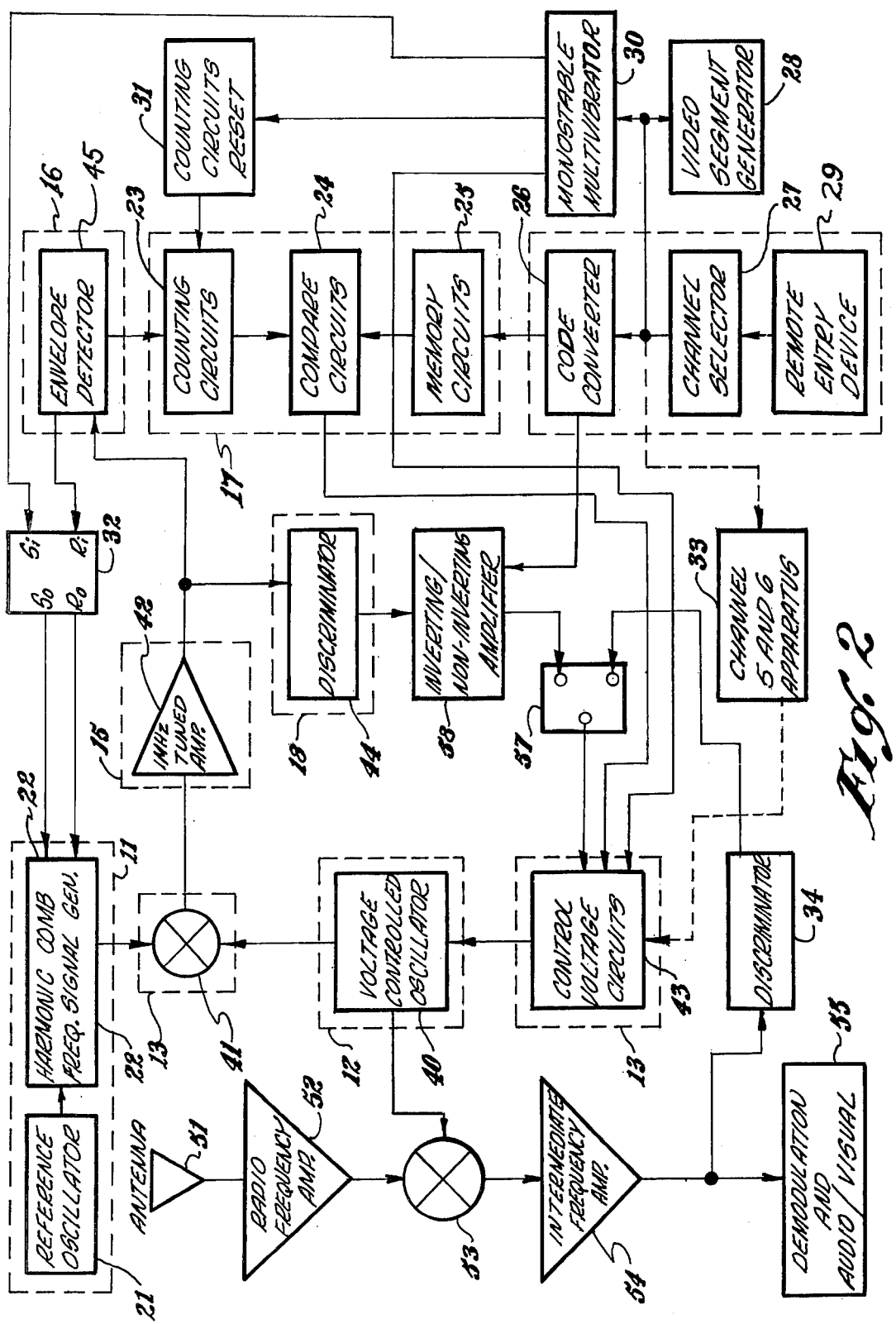
FIG. 2 is a schematic block diagram of the apparatus comprising the preferred embodiment of the invention along with related apparatus.

Referring next to FIG. 2, the preferred embodiment of the invention in a television receiver environment is shown. An antenna 51 receives television broadcast signals and applies these received signals to apparatus of a television receiver. However, antenna 51 could be replaced by a cable television terminal or other apparatus for applying signals encoded at video channel frequencies to the television receiver unit.

The television receiver input signal is applied to a video frequency amplifier 52, and the output signal of amplifier 52 is applied to heterodyne converter transducer 53. The video frequency signal is mixed in transducer 53 with the local oscillator signal generated by a voltage controlled oscillator 40. The output signal of transducer 53 is applied to an amplifier 54 (typically tuned to 45.75 MHz intermediate frequency), and the output signal of amplifier 54 is applied to demodulator and audio/visual output apparatus 55.

In order to select a specified frequency or channel, the difference between the frequency of the selected channel and the voltage controlled oscillator 40 must be equal to the intermediate frequency to which amplifier 54 is tuned. Therefore, an appropriate output signal of the voltage controlled oscillator 40 is necessary to select a channel.

An output signal of voltage controlled oscillator 40 is applied to heterodyne conversion transducer 41. The signal from a reference oscillator 21 is applied to a harmonic comb frequency generator 22. Generator 22 produces a comb of equally spaced frequency signal components (i.e. in the frequency domain), the spacing being a harmonic of the output signal of oscillator 21. The output signal from harmonic frequency comb signal generator 22 is also applied to transducer 41. A first and a second output terminal of logic gate 32 are coupled to comb signal generator 22.

The output signal from transducer 41 is applied to an intermediate frequency amplifier 42, tuned to 1 MHz. The output signal of amplifier 42 is applied to envelope detector 45 and to discriminator 44. The output signal of discriminator 44 is applied to inverting/noninverting amplifier 58. The output signal of amplifier 58 is applied to one input position of a two position switch 57.

The envelope detector 45 produces a pulse output signal each time a 1 MHz beat frequency signal is applied to the output terminal of amplifier 42. The pulse signal is applied to counting circuits 23 and to a second input terminal of logic gate 32. Counting circuits 23 count the pulses produced by envelope detector 45.

The selection of a frequency is performed by means of channel selector 27. This selection may be performed manually, for example by keyboard entry, or with assistance of a remote entry device 29. The channel selector apparatus 27 is coupled to code converter 26, to monostable multivibrator 30, and to video segment generator 28. The code converter 26 is coupled to memory circuits 25, and both memory circuits 25 and counting circuits 23 are coupled to compare circuit 24. Compare circuit 24 is coupled to control voltage circuits 43.

Monostable multivibrator 30 is coupled to a first input terminal of logic gate 32, to counting circuit reset 31 and to control voltage circuits 43.

The output signal from amplifier 54 is applied to discriminator 34, and the output signal from discriminator 34 is applied to a second input terminal of the switch 57.

Channel 5 and channel 6 apparatus 33 is coupled to channel selector 27 and to control voltage circuits 43. Control voltage circuits 43 is coupled to voltage controlled oscillator 40.

Figure 3:
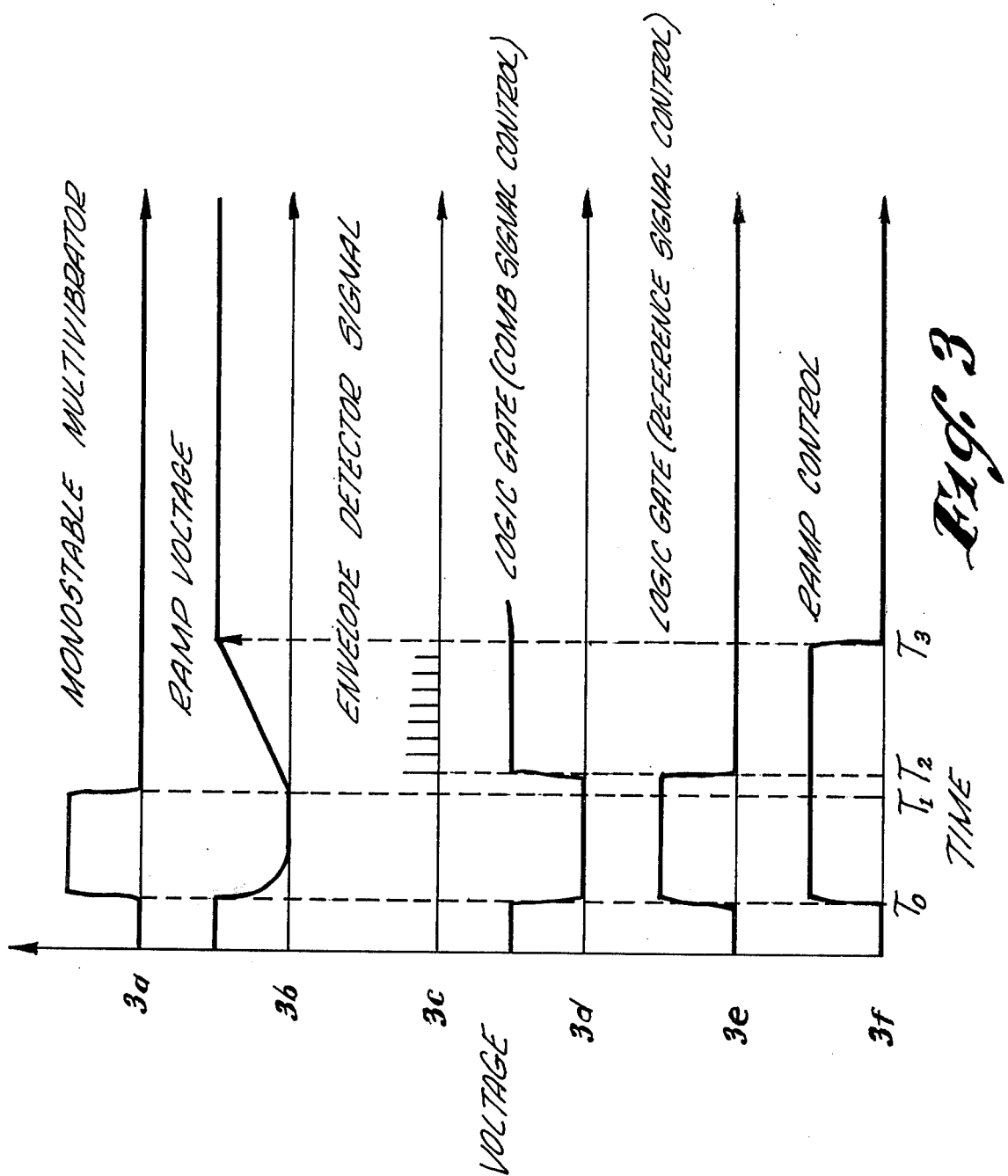
FIG. 3 displays idealized waveforms appearing at various locations of the preferred embodiment in order to illustrate operation.

Referring next to FIG. 3, idealized output signals at several location of FIG. 2 are shown. In FIG. 3(a) the output signal of the monostable multivibrator 30 is a positive value between $T_0$ and $T_1$. In FIG. 3(b) a reset voltage signal, supplied by control voltage circuits 43 to the voltage controlled oscillator, attains an equilibrium value during an interval beginning at $T_0$, begins monotonically increasing at $T_1$, and is maintained at an equilibrium value after $T_3$. FIG. 3(c) shows the output of the envelope detector signal. Pulses begin at $T_2$ and continue until $T_3$ is reached. FIG. 3(d) shows the output voltage of a logic signal applied by a first terminal logic gate 32 to signal generator 22. At time $T_0$, the logic signal applied to signal generator 22 becomes a zero value and at time $T_2$, the logic signal becomes a positive value. The presence of a positive signal provides for the presence of 6 MHz harmonic comb frequency components. FIG. 3(e) shows the logic signal applied by gate 32 to generator 22. The logic signal becomes a positive value at time $T_0$ and becomes a zero logic signal at time $T_2$. The presence of this positive signal provides for the presence of 24 MHz comb frequency signal components from the reference signal generator. In FIG. 3(f), the control signal, applied by the compare circuits 24 to the control voltage circuits 43 is a positive value beginning at $T_0$ and becomes a zero value at time $T_3$.

Operation of the Preferred Embodiment

The operation of the preferred embodiment can be understood by consideration of FIG. 2 along with FIG. 3. Upon selection of a television channel (i.e. corresponding to a selected frequency of the output signal of the voltage controlled oscillator) by entering a number in channel selector 27 by means of the remote entry device 29 or otherwise, a signal from channel selector 27 is delivered to the monostable multivibrator 30 causing the output signal of the multivibrator to assume a positive value at a time $T_0$. This causes a positive signal at terminal $S_0$ of logic gate 32 which enables the generation of a 24 MHz comb of harmonic frequency signal components by generator 22. The concurrent zero signal terminal $R_0$ disables the generation of a 6 MHz harmonic comb frequency components. Frequency generator 21 is comprised of a 24 MHz crystal oscillator in the preferred embodiment, either the 24 MHz comb frequency signal components or the 6 MHz harmonic comb frequency components comprise the output signal of the generator 22.

In addition, a signal from multivibrator 30 is applied to counting circuits reset 31. The circuits 31 reset the counts stored in counting circuits 23 to an initial predetermined value. A signal from multivibrator 30 is also applied to control voltage circuits 43. This signal causes the output voltage from circuits 43 to achieve a predetermined equilibrium value in the time interval between $T_0$ and $T_1$ and results in a predetermined initial frequency of the output signal of the voltage controlled oscillator. The monostable multivibrator 30 maintains the positive output signal for the duration of time which the circuit remains in the astable state, i.e. the time from $T_0$ to $T_1$.

The entry of a channel designation in channel selector 27 causes signals corresponding to the designated channel frequency to be applied to code converter 26. The code converter 26 changes the frequency designation from an arbitrary format (i.e. channel number) to a related entry number. The entry number, being related to the predetermined initial oscillator output signal as well as other parameters, can bear a complicated relationship to the designated channel. The entry number is entered in memory circuits 25 and is compared, by means compare circuits 24, with a count number in memory circuits of counting circuits 23. The activation of reset circuit 31 sets the count number to a predetermined value. A lack of identity between the entry number and the count number will cause the compare circuits to apply a positive signal to control voltage circuits 43, which can cause the output voltage to attain a specified value. However, the positive signal from the multivibrator 30 has priority and causes the predetermined value of voltage to be applied to voltage controlled oscillator 40 as long as the positive multivibrator signal is present.

When the multivibrator 30 returns to the stable configuration at time $T_1$, the signal from the compare circuits 24 causes the output signal at the voltage controlled oscillator to increase. The increasing voltage applied to the voltage controlled oscillator causes the frequency of the output signal of the voltage controlled oscillator to increase simultaneously. The oscillator output signal is mixed in transducer 41 with the 24 MHz signal from the comb frequency signal generator.

When the frequency of the output signal of the voltage controlled oscillator reaches 1 MHz below the first 24 MHz harmonic encountered by the increasing local oscillator signal frequency, amplifier 42, tuned to 1 1 MHz applies the beat frequency signal resulting from the mixing of the comb signal generator and the voltage controlled oscillator to envelope detector 45. The occurrence of the beat frequency signals causes detector 45 to apply a pulse to counting circuits 23, as well as a positive logic signal to Terminal $R_i$ of gate 32. The pulse applied to counting circuits 23 causes the count number in the memory of counting circuits 23 to increment by one. The pulse applied to gate 32 causes the $S_0$ signal applied to signal generator 22 (and resulting in a comb of 24 MHz harmonic frequency components being applied to transducer 41) to be removed and a positive signal applied to terminal $R_0$ is applied to comb signal generator 22. The positive signal at terminal $R_0$ results in a 6 MHz comb of harmonic frequency components being applied to transducer 41. As the frequency of the voltage controlled oscillator output signal continues to increase, the beat frequency signal occurs when the oscillator output voltage frequency and the frequency of one of the comb frequency harmonic components differ by 'MHz. The count number in the memory circuit of counting circuits 23 are incremented with each beat frequency signal pair identified by detector 45.

When the count number in counting circuits 23 and the entry number of memory circuits 25 are the same, the positive signal applied to control voltage circuits 43 is removed. With the removal of the positive signal (i.e. at time $T_3$) an automatic frequency control loop controls oscillator 40. The AFC loop is comprised of discriminator 44, amplifier 58, control voltage circuits 43, voltage controlled oscillator 40, transducer 41, and amplifier 42. This apparatus maintains the voltage of the voltage controlled oscillator at the frequency determined by the frequency designation entered in channel selector 27. The output signal of oscillator 40 is mixed with the incoming signals from antenna 51 and results in an intermediate frequency of 45.75 MHz for the information of the selected channel. The selected channel information will be applied to output apparatus 55. Amplifier 58 will provide amplified output signal of discriminator 44 with a positive or negative sign depending on which of the two beat frequency signals (i.e. 1 MHz above or below the related comb frequency harmonic component) is utilized in the AFC loop. The sign utilized by this amplifier can be determined by a signal from the code converter.

The oscillator 40 signal frequencies needed to tune the standard television channels are 101 MHz to 113 MHz in 6 steps (channels 2 through 4), 221 MHz to 257 MHz in 6 MHz steps (channels 7 through 13) and 517 MHz to 931 MHz in 6 MHz steps (channels 14 through 83). 101 MHz, 107 MHz, 113 MHz, and 221 MHz through 257 MHz all are 1 MHz below 6 MHz harmonic signals (i.e. generated by the comb signal generator). Similarly 517 MHz through 931 MHz are 1 MHz above the 6 MHz harmonic signals. By enabling and operating the automatic frequency control loop through appropriate 1 MHz beat frequency of the nearest 6 MHz harmonic frequency signal, the voltage controlled oscillator signal is stabilized at a frequency appropriate to provide demodulation of the incoming signals by the television receiver.

The selection of the appropriate beat frequency signal from the sequence of beat frequency signals is determined by the entry number. Code converter 26 specifies the count number which is related to each program channel. In the preferred embodiment, code converter 26 utilizes a programmable read-only memory. By changing to a different programmable read-only memory, a variety of input devices can be utilized with the television receiver.

To enhance the flexibility of the invention, a second automatic frequency control loop comprised of heterodyne converter transducer 53, tuned amplifier 54, discriminator 34, control voltage circuits 43, and voltage controlled oscillator 40 is provided. This circuit can be placed in operation by appropriate positioning of switch 57. This loop allows the effective demodulation of channels on which, as opposed to commercial broadcast channels, drift of the frequency of the information bearing channel can be a problem.

To accommodate channel 5 and channel 6, which do not have a convenient frequency relationship to 6 MHz harmonic frequencies, separate apparatus 33 can be included. For example, a potentiometer can be used to provide the appropriate voltage level at the output of control voltage circuit 43, thereby providing the desired frequency of the output signal of oscillator 40. In another embodiment, the entry of channel 5 or channel 6 in the channel selector 27 can activate a special oscillator causing an appropriate frequency (or frequencies) to be applied to transducer 41.

The video segment generator 28 is used in the preferred embodiment to display the channel entered in the television receiver on the display tube face.

In the preferred embodiment, a receiver operator can enter any channel designation (except 5 and 6) in the channel selector and the disclosed apparatus, starting at a predetermined initial position will sequentially cycle through consecutive channel signal frequencies until the appropriate local oscillator signal frequency is obtained. Because of the rapid time of the electronic tuning, the cycling is not apparent and the apparatus provides the information from the selected channel to the audio/visual output apparatus without noticable delay.

It will be apparent that the frequency of the oscillator 40 can begin between the 3rd and 4th harmonic of the 24 MHz comb frequency components. The counting number can then be incremented beginning with the 1 MHz beat frequency signal below the 4th harmonic of the 24 MHz comb frequency generator signal. Thus the control voltage circuits output signal, during the interval $T_0$ to $T_1$, does not reach a zero value but instead produces a voltage value causing an oscillator signal frequency lying between 73 MHz ($3 \times 24$ MHz $+ 1$ MHz) and 95 MHz ($4 \times 24$ MHz $- 1$ MHz). As will be apparent, another implementation involves the value of the output signal oscillator 40 achieving an initial frequency value between the 4th and 5th harmonics of the 24 MHz harmonic frequency comb, decreasing the oscillator frequency until the beat frequency signal above the 4th harmonic of the 24 MHz comb generator signal produced a count. The frequency of the oscillator output signal is thereafter changed in the direction of increasing signal frequency. It is also possible to initiate the oscillator output frequency between appropriate ($n \times 6$ MHz $+ 1$ MHz) and ($[n + 1]6$ MHz $- 1$ MHz) frequencies thereby dispensing with the 24 MHz harmonic comb, however more accurate control of the initial output signal of the control voltage circuits is required. It will also be apparent that the initial oscillator output signal frequency can be made dependent on the channel designation. Because of the rapidity of the electronic frequency sweep, this implementation can add apparatus complexity without a corresponding increase in view-identifiable performance.

It will be clear to those skilled in the art that the reference oscillator can provide a frequency other than 24 MHz (e.g. 12 MHz) in relative embodiments without affecting the underlying principles of operation.

The present implementation of the preferred embodiment envisions logic signal comparison between the count number and the entry number. It will be apparent that other data manipulation schemes can be utilized. For example, code converter 26 can enter a quantity directly into register units of counting circuits 23. Thereafter, identification of beat frequency signals increments or decrements the register unit until a predetermined register state causes the removal of the positive signal applied to control voltage circuits 43.

The above description is included to illustrate the operation of the preferred embodiment and is not meant to limit the scope of the invention. The scope of the invention is to be limited only by the following claims. From the above discussion, many variations would yet be apparent to one skilled in the art that would yet be encompassed by the spirit and scope of the invention.

What is claimed is:

1. An electronic system for tuning a receiver to a selected television channel comprising:
   a. a voltage controlled oscillator;
   b. a voltage signal generator for sweeping and holding the frequency of said oscillator;
   c. a harmonic comb frequency generator for generating a first plurality of signals at 24 MHz frequency intervals, and a second plurality of signals at 6 MHz frequency intervals, said first plurality of signals being generated in response to a channel selection signal, said second plurality of signals being generated in response to a first actuating signal;
   d. a mixing circuit for heterodyning the output signal of said oscillator with the output signal of said harmonic comb frequency generator;
   e. a tuned amplifier connected to said mixing circuit for transmitting beat frequency signals of a predetermined frequency in the output signal of said mixing circuit;
   f. an envelope detector connected to said tuned amplifier for converting said beat frequency signals to pulses, said envelope detector providing said first actuating signal to said harmonic comb frequency generator in response to a first beat frequency signal;
   g. counting circuits connected to said envelope detector for counting said beat frequency signal pulses;
   h. memory circuits for storing an entry number related to said selected television channel;
   i. compare circuits for comparing said beat frequency pulse count in said counting circuits with said entry number in said memory circuits and for applying a second actuating signal to said voltage signal generator for stopping frequency sweeping of said oscillator when a preestablished relationship between said entry number and said pulse count exists; and
   j. a discriminator continuously coupled between said tuned amplifier and said signal generator and cooperative therewith for stabilizing said oscillator frequency.

* * * * *